United States Patent

Navarrete et al.

[19]

[11] Patent Number: 6,106,322

[45] Date of Patent: Aug. 22, 2000

[54] ELECTRICAL CONNECTIONS

[75] Inventors: Silverio Muela Navarrete, Cadiz, Spain; Malcolm John Livermore, Chelmsford, United Kingdom; Jose Luis Pancorbo, Cadiz, Spain; Richard Keith Atkins, Chelmsford, United Kingdom

[73] Assignee: Visteon Global Technologies, Inc., Dearborn, Mich.

[21] Appl. No.: 09/133,909

[22] Filed: Aug. 13, 1998

[30] Foreign Application Priority Data

Aug. 13, 1997 [GB] United Kingdom .................. 9717036

[51] Int. Cl.$^7$ .................................................. H01R 13/64
[52] U.S. Cl. ............................................. 439/381; 439/74
[58] Field of Search .......................... 439/74, 381, 380, 439/374, 567, 108; 29/845, 842

[56] References Cited

U.S. PATENT DOCUMENTS

| | | | |
|---|---|---|---|
| 4,054,345 | 10/1977 | Sherwood | 439/381 |
| 4,200,347 | 4/1980 | Sinclair et al. | 439/381 |
| 5,507,653 | 4/1996 | Stoner | 439/74 |
| 5,775,947 | 7/1998 | Suzuki et al. | 439/108 |
| 5,797,768 | 9/1998 | Francaviglia | 439/567 |

*Primary Examiner*—Paula Bradley
*Assistant Examiner*—Alexander Gilman
*Attorney, Agent, or Firm*—Larry I. Shelton

[57] ABSTRACT

In order to space apart the terminal pins 12 of an electrical component 10 before the component is mounted on a printed circuit board 16, the component is placed in a guide body 18 which has pin guide sockets 32 with funnel-like mouths through which the pins pass to be guided through apertures 36 which are offset to different sides of an imaginary median line of the sockets.

14 Claims, 2 Drawing Sheets

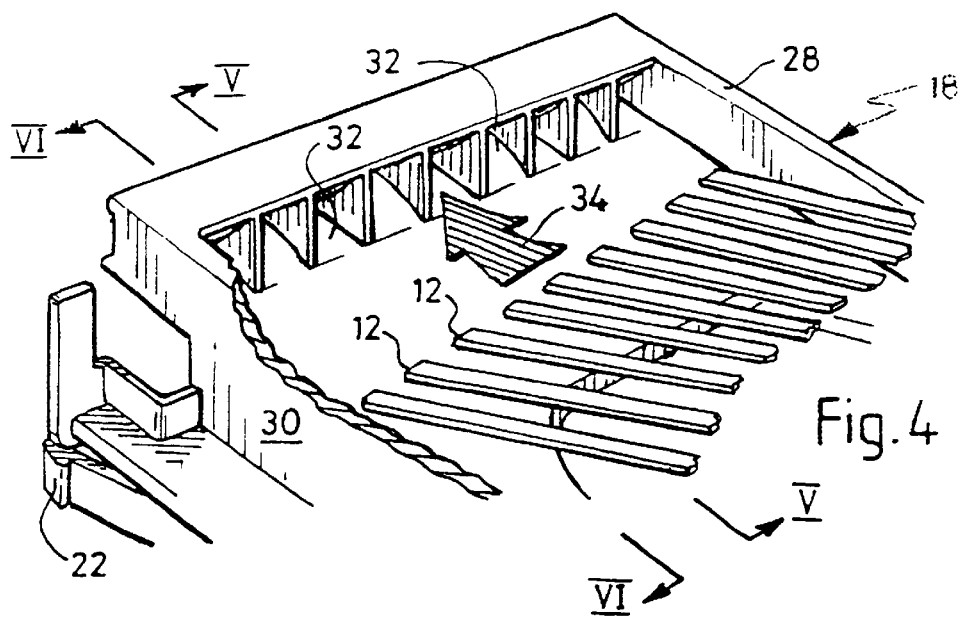
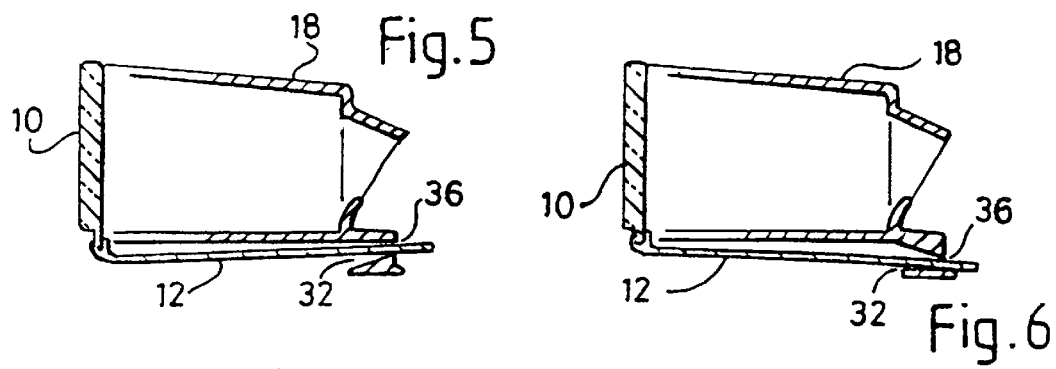
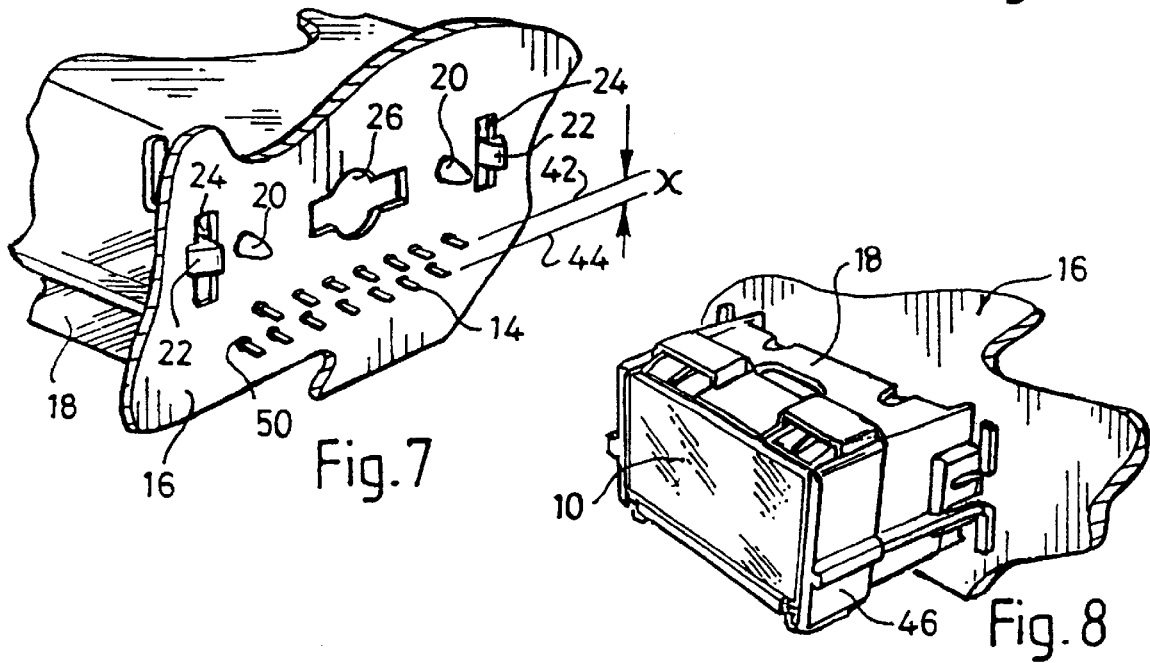

ELECTRICAL CONNECTIONS

FIELD OF THE INVENTION

This invention relates to apparatus for making electrical connections between an electronic component which has multiple terminals, and a printed circuit board.

BACKGROUND OF THE INVENTION

When components are mounted on a printed circuit board, it is conventional to pass a terminal pin of the component through a hole in the printed circuit board (PCB) and then to turn the PCB over and apply solder on the back of the PCB to the protruding pin, so that the pin makes electrical contact with a pattern of conducting tracks printed on the back of the board.

There is an increasing trend to miniaturisation of electronic components, with the result that the component terminals for receiving or outputting signals are clustered in an ever smaller space. Where each terminal has to be soldered to a distinct track on a PCB, it is often difficult to ensure that there is a discrete connection made to each component, without bridging between adjacent tracks and/or adjacent pins.

This problem typically applies to electronic components such as integrated circuits and liquid crystal display panels (LCD panels). The invention is not however restricted to use with these components or indeed any other specific electronic components.

SUMMARY OF THE INVENTION

According to the invention, there is provided a pin guide body for use in making electrical connections between a printed circuit board and an electronic component which has multiple terminals and a plurality of parallel pins extending from an edge thereof, one pin being attached to each terminal, the pin guide body having a portion for receiving the component itself and guide sockets for receiving and arranging the relative positions of the pins, the body also having locating means for locating the body at a predetermined position on a printed circuit board, the guide sockets having funnel-like mouths for receiving and guiding the ends of the pins through respective apertures, the apertures being alternately offset to different sides of an imaginary median line of the sockets.

By guiding the pins so that they are offset relative to one another, the spacing between the pins is substantially increased, so that the points at which the pins are to be soldered to the PCB are spaced apart resulting in less risk of bridging between the pins.

The guide body may have a depth, that is a dimension in the direction of the length of the pins, which is determined in order to mount the component a predetermined distance above the PCB. This may be particularly useful in the case of a LCD panel which has to be presented for display at a particular point.

The component receiving portion is preferably spaced from the guide sockets in the direction in which the funnel-like mouths open and can be located on top of a tubular support, the support providing the spacing between the receiving portion and the sockets and providing a space in which an illumination source can be located.

Where the component is a liquid crystal display panel, and the component receiving portion preferably receives the panel without obstructing the back of the panel. A sleeve can be provided which fits around the periphery of the panel and clips to the support to secure the panel in place.

The guide body can have locating and latching means for locating and securing it to a printed circuit board in a predetermined location on the board. The locating means can comprise tapered pegs on the body which locate in holes in a printed circuit board. The latching means are preferably independent of the locating means.

The guide sockets can each comprise four flat converging walls, with all the sockets having their entry openings lying along a single straight line and their exit opening lying other than on a single straight line.

The apertures can lie in two or more rows.

The invention also provides a method of guiding a row of electrical terminal pins to their correct relative positions prior to locating those pins in a printed circuit board, the method comprising the steps of guiding alternate pins to opposite sides of a single plane, so that the pins are arranged in an array where they are spaced both longitudinally and laterally from their neighbours.

The array of pins can form a zig-zag line.

BRIEF DESCRIPTION OF THE DRAWINGS

The invention will now be further described, by way of example, with reference to the accompanying drawings, in which:

FIG. 4 illustrates the terminal pins being offered up to guide sockets in the guide body;

FIGS. 5 & 6 are, respectively, sections through the guide body on the lines V—V and VI—VI from FIG. 4;

FIG. 7 is a view of the face of the printed circuit board on to which components will be soldered; and FIG. 8 is a front view of the components assembled on a printed circuit board.

DETAILED DESCRIPTION OF THE PREFERRED EMBODIMENTS

Figure 1:
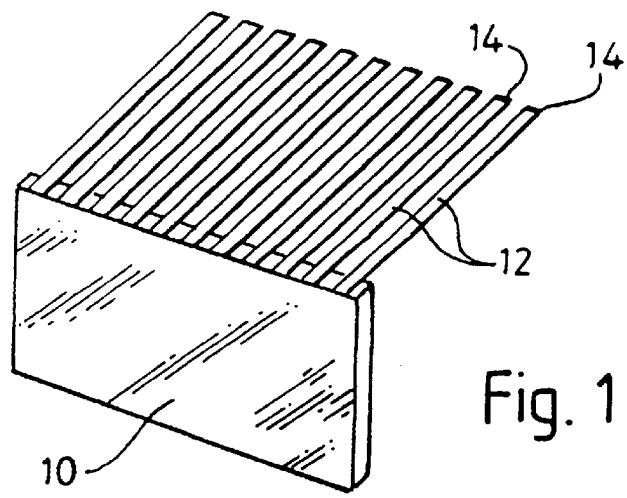
FIG. 1 is a perspective view of a LCD panel with a plurality of parallel connection pins extending from one edge.

FIG. 1 shows a conventional liquid crystal display panel 10 (hereinafter referred to as a "LCD panel") with eleven parallel pins 12 extending from one edge. The pins can be for example 40 mm long. The pins all extend in one plane, and their ends 14 are, at this stage, free and are not restrained in any way other than by the rigidity of the metal from which they are made.

Although eleven pins are shown in FIG. 1, it will be understood that the number of pins actually present will depend on the number of functions to be displayed on the LCD panel 10 and therefore there may be a greater or lesser number than eleven. Indeed, panels with different numbers of pins are shown in the accompanying drawings.

In fact, in one particular embodiment, there were twenty-two pins, spaced apart with a pitch of 1.8 mm. The pins are conveniently of rectangular cross section, with the major dimension of the pin cross section lying in the plane of the pins.

The panel 10 is to be mounted on a printed circuit board 16, at a distance above the surface of the board. The height above the board at which the panel will be mounted is determined by the depth of a support and pin guide body 18

Figure 2:
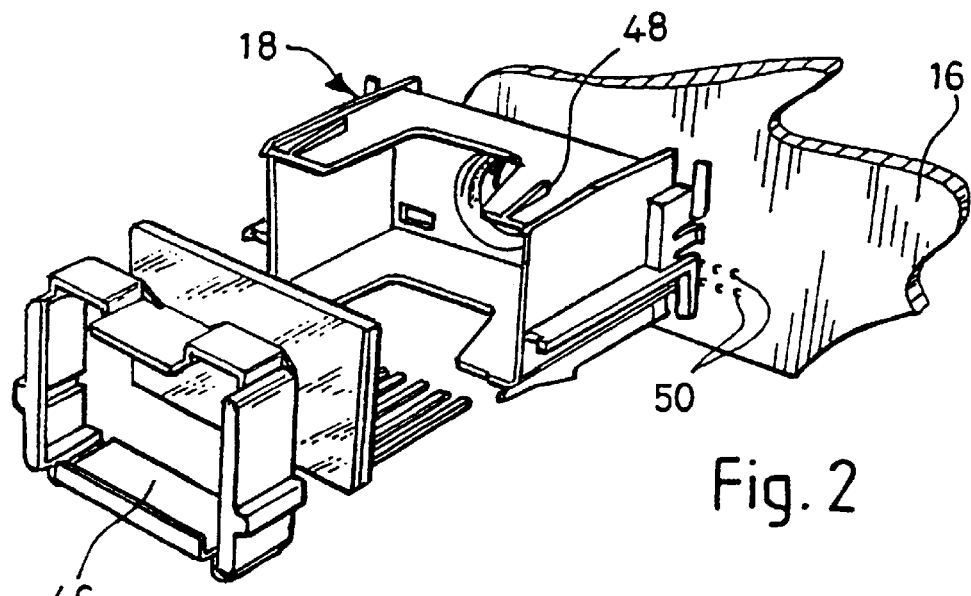
FIG. 2 is an exploded view of an assembly of the LCD panel of FIG. 1 with a printed circuit board.

(FIG. 2). The guide body 18 locates on the circuit board 16 through positioning pegs 20 (FIG. 7) which are molded into the structure of the body 18, together with latch keys 22 which snap into elongated recesses 24 on the printed circuit board.

It will also be seen from FIG. 7 that the printed circuit board includes an opening 26 through which a light bulb, for illumination of the display, can be fitted. The guide body 18 therefore also serves as a light directing body to contain and direct light to the back face of the LCD display.

Figure 3:
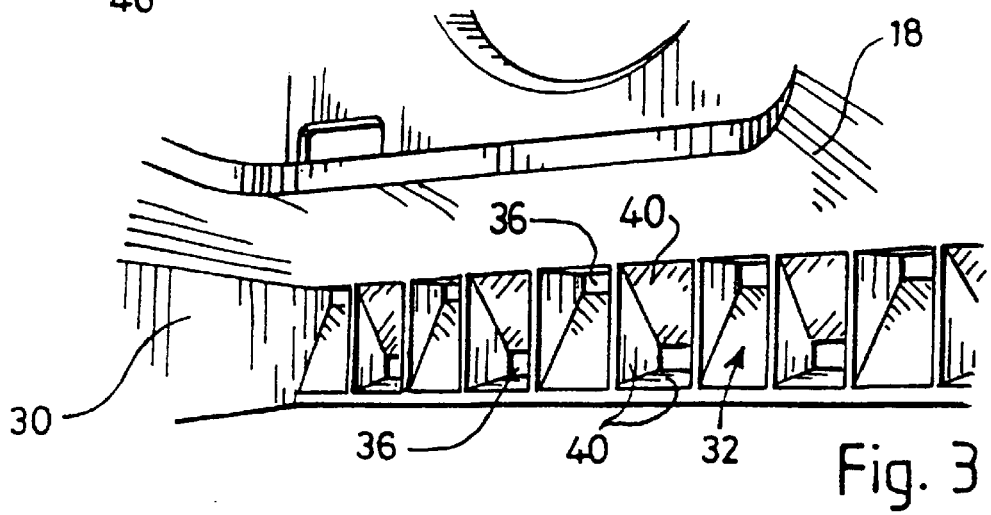
FIG. 3 is a detail on an enlarged scale of part of the guide body of FIG. 2.

The guide arrangement for the pins 12 is on one side of the body 18 which is the underside as shown in FIG. 2. FIGS. 3 & 4 show more details of the formation of the guide body 18 on this side of the body.

As can be seen in FIG. 4, the pins 12 (in this case only nine pins are shown) are guided between end walls 28 & 30 toward funnel-shaped sockets 32. There is a socket 32 for each pin 12. An arrow 34 indicates the direction of insertion.

FIG. 3 shows views into these sockets 32, and it will be seen that at the base of each socket there is a through aperture 36. In one socket 32, the aperture 36 is at the bottom and in the next socket the aperture 36 is at the top, and the apertures alternate in this way across the width of the body 18. The internal surfaces 40 of each socket are smooth and all converge toward the respective aperture 36, so that once the tip of a pin enters the socket, it is irrevocably guided to the respective aperture 36, and in this way the initially parallel array of pins is redirected into two parallel arrays, as can be seen particularly in FIG. 7. Here there are two parallel lines of pins, indicated at 42 and 44, and these pins are spaced apart by a distance x which, typically, may be 2.5 mm.

If the pins were initially spaced apart with a pitch of 1.8 mm, the pins in each row will now be spaced apart by twice that distance, i.e. 3.6 mm, within each row 42 and 44 and will be spaced apart from any pins in the next row by at least the vertical distance x (2.5 mm) between the rows.

There will be correspondingly positioned apertures 50 through the PCB through which the spaced pin ends 14 will be inserted. Printed tracks on the back of the PCB will be aligned with the apertures 50, and these tracks can thus be positioned so that the spacing between them and between the pins where they will be soldered to the rear face of the printed circuit board is substantially increased so that when the soldering operation takes place, there is a much reduced risk of any solder bridges forming to bridge between two components, which cannot be allowed to happen.

In practice, the LCD panel 10 is assembled to the guide body 18, so that the pin ends 14 extend through the apertures 36 by a distance sufficient to allow them also to project through the circuit board apertures 50.

A retaining cover 46 is then fitted over the panel 10 and is retained on tapered lugs 48 on the body. When this cover is in place, the panel 10 is permanently associated with the guide body 18, and this forms a sub-assembly with precisely positioned projecting pin ends 14.

The cover 46 is preferably made of black plastic to cut out any unwanted light transmission between the other illuminated parts of an instrument cluster and the LCD panel, and vice versa.

The body 18 can be a single molded plastic component, with the cover 46 being a snap fit onto the body.

FIGS. 7 and 8 show a completed sub-assembly after fitting to a circuit board 16. FIG. 7 shows this from behind the board (before soldering) and FIG. 8 is a view from the opposite side of the board.

The use of the guide body allows the panel 10 to be correctly positioned relative to a circuit board, while the relatively long pins 12 which are required to extend between the panel and the board are guided and located to the correct positions. Once the subassembly has been completed, the pins are safe from damage.

What is claimed is:

1. A pin guide body for use in making electrical connections between the printed circuit board and an electronic component which has multiple terminals and a plurality of parallel pins aligned in rows extending from an edge thereof, one pin being attached to each terminal, the pin guide body having a portion for receiving the component itself and guide sockets for receiving and arranging the relative positions of the pins, the body also having locating means for locating the body at a predetermined position on a circuit board, with the guide sockets having funnel-like mouths for receiving and guiding the ends of the pins through respective apertures, wherein said funnel-like mouths being configured asymmetrically with regard to axes of the initially aligned pins, so that the pins are alternately guided in a zig-zag fashion when forced into the funnel-like mouths.

2. A guide body as claimed in claim 1, having a component receiving portion, wherein the component receiving portion is spaced from the guide sockets in a direction of said parallel pins.

3. A guide body as claimed in claim 2, wherein the component receiving portion is located on top of a tubular support, the support providing the spacing between the receiving portion and the sockets and providing a space in which an illumination source can be located.

4. A guide body as claimed in claim 1, wherein the component is a liquid crystal display panel and the component receiving portion receives the panel without obstructing the back of the panel.

5. A guide body as claimed in claim 4, wherein a sleeve is provided which fits around the periphery of the panel and clips to the support to secure the panel in place.

6. A guide body as claimed in claim 1, wherein the body has locating and latching means for locating and securing it to a printed circuit board in a predetermined location.

7. A guide body as claimed in claim 6, wherein the locating means comprise tapered pegs on the body which locate in holes in a printed circuit board.

8. A guide body as claimed in claim 7, wherein the latching means are independent of the locating means.

9. A guide body as claimed in claim 1, wherein the guide sockets have an entry and an exit opening and each guide socket comprises four flat converging walls, with all the sockets having their entry openings lying along a single straight line and their exit openings lying on two parallel lines.

10. A guide body as claimed in claim 9, wherein the exit openings lie in two rows.

11. A guide body as claimed in claim 9, wherein the exit openings lie in more then two rows.

12. A method of guiding a row of electrical terminal pins to their correct relative positions prior to locating those pins in a printed circuit boards, the method comprising the steps of guiding alternate pins through guide sockets having funnel-like mouths for receiving and guiding ends of said pins through respective apertures, wherein said funnel-like mouths are configured asymmetrically with regard to axes of the initially aligned pins, so that the pins are alternately guided in a zig zag fashion when forced into the tunnel-like mouths.

13. A method as claimed in claim 12, wherein the array of pins forms a zig-zag line.

14. A pin guide body for use in making electrical connections between a printed circuit board and an electronic component which has multiple terminals and a plurality of initially straight, parallel pins extending from a linear edge thereof to respective distal ends, one pin being attached to each terminal, said pin guide body having guide sockets for receiving and arranging the relative positions of said respective distal ends of said pins, said body also having location means for locating said body at a predetermined position on a printed circuit board, with said guide sockets having funnel-like mouths for receiving and guiding said distal ends of said pins through respective apertures, wherein said apertures are each located at a respective base of a corresponding guide socket, wherein said pins are alternately guided in a zig-zag fashion when forced into the funnel-like mouths.

* * * * *